US010260161B2

(12) United States Patent
Rauenbusch et al.

(10) Patent No.: US 10,260,161 B2
(45) Date of Patent: Apr. 16, 2019

(54) SUBSTRATE HOLDER RECEPTION APPARATUS

(71) Applicant: Atotech Deutschland GmbH, Berlin (DE)

(72) Inventors: Ralph Rauenbusch, Berlin (DE); Tobias Bussenius, Berlin (DE); Stefan Vitzthum, Burgthann (DE)

(73) Assignee: Atotech Deutschland GmbH, Berlin (DE)

(*) Notice: Subject to any disclaimer, the term of this patent is extended or adjusted under 35 U.S.C. 154(b) by 0 days.

(21) Appl. No.: 15/535,424

(22) PCT Filed: Aug. 4, 2016

(86) PCT No.: PCT/EP2016/068636
§ 371 (c)(1),
(2) Date: Jun. 13, 2017

(87) PCT Pub. No.: WO2017/021489
PCT Pub. Date: Feb. 9, 2017

(65) Prior Publication Data
US 2018/0347064 A1 Dec. 6, 2018

(30) Foreign Application Priority Data
Aug. 5, 2015 (EP) .................................... 15179883

(51) Int. Cl.
*C25D 17/06* (2006.01)
*C25D 17/00* (2006.01)
(Continued)

(52) U.S. Cl.
CPC ........... *C25D 17/06* (2013.01); *C25D 17/001* (2013.01); *C25D 17/005* (2013.01); *C25D 21/00* (2013.01);
(Continued)

(58) Field of Classification Search
CPC .... C25D 17/001; C25D 17/005; C25D 17/06; C25D 21/02; H01L 21/68; H01L 21/687
See application file for complete search history.

(56) References Cited

U.S. PATENT DOCUMENTS

| 5,522,975 A | 6/1996 | Andricacos et al. |
| 7,874,260 B2 | 1/2011 | Armanini |
| (Continued) | | |

FOREIGN PATENT DOCUMENTS

| EP | 2813602 | 12/2014 |
| JP | 2007291463 | 11/2007 |

OTHER PUBLICATIONS

PCT/EP2016/068636; PCT International Search Report and Written Opinion of the International Searching Authority dated Oct. 10, 2016.

(Continued)

*Primary Examiner* — Ciel P Thomas
(74) *Attorney, Agent, or Firm* — Renner, Otto, Boisselle & Sklar, LLP

(57) ABSTRACT

This invention concerns a substrate holder reception apparatus (1) for clamping a substrate holder (11) in a substrate holder clamping direction (SHCD) in a predetermined position of the substrate holder (11) and releasing the substrate holder (11), comprising at least one substrate holder connection device (21) for mechanical aligning and electrically contacting of the substrate holder (11), wherein the substrate holder connection device (21) comprises a separate substrate holder alignment device (211) for aligning the substrate holder (11) with the substrate holder connection device (21) in an alignment direction, and a separate substrate holder contact device (212) for electrically contacting the substrate
(Continued)

Figure 1:
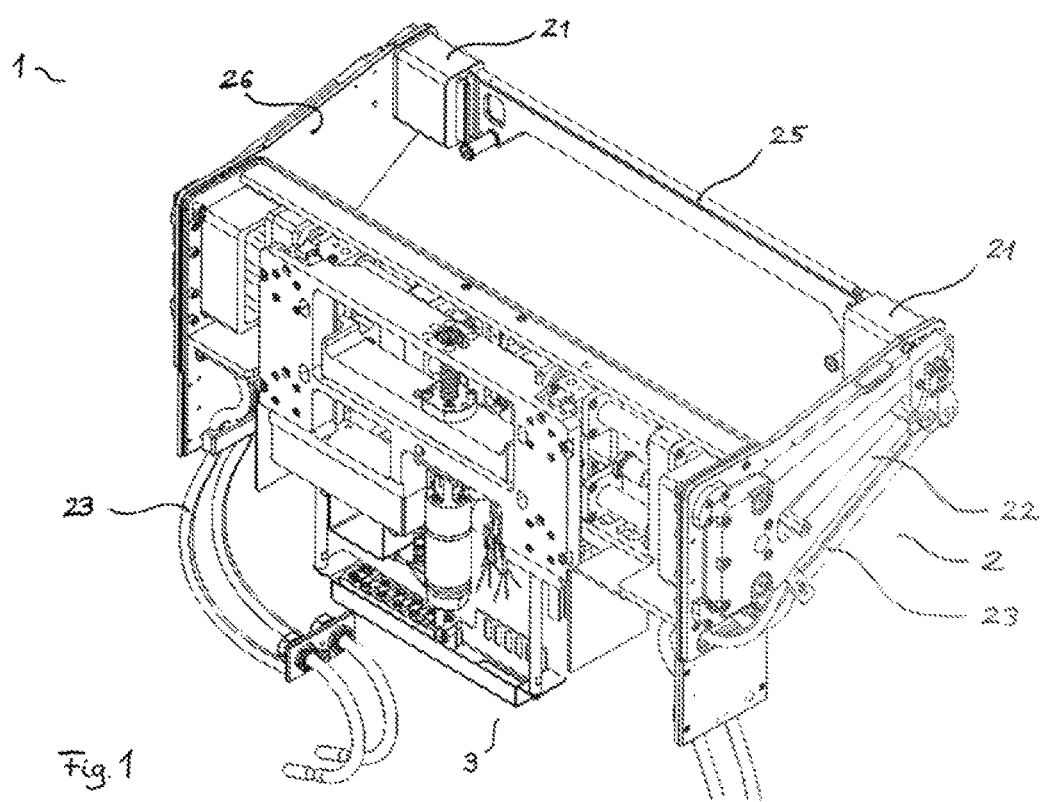

holder (11). Further, the invention concerns an electrochemical treatment apparatus (5) comprising the substrate holder reception apparatus (1).

20 Claims, 11 Drawing Sheets

(51) Int. Cl.
*C25D 21/00* (2006.01)
*C25D 21/02* (2006.01)
*H01L 21/68* (2006.01)
*H01L 21/687* (2006.01)

(52) U.S. Cl.
CPC .............. *C25D 21/02* (2013.01); *H01L 21/68* (2013.01); *H01L 21/687* (2013.01)

(56) References Cited

U.S. PATENT DOCUMENTS

2006/0043925 A1 3/2006 Tuin
2014/0342212 A1 11/2014 Goesmann et al.

OTHER PUBLICATIONS

Search Report for corresponding Taiwanese Application No. 105125025 dated Aug. 29, 2018.
Official Action for corresponding Chinese Application No. 201680004127.8 dated Nov. 5, 2018.

SUBSTRATE HOLDER RECEPTION APPARATUS

The present application is a U.S. National Stage Application based on and claiming benefit and priority under 35 U.S.C. § 371 of International Application No. PCT/EP2016/068636, filed 4 Aug. 2016, which in turn claims benefit of and priority to European Application No. 15179883.2 filed 5 Aug. 2015, the entirety of both of which is hereby incorporated herein by reference.

This invention concerns a substrate holder reception apparatus for clamping a substrate holder in a substrate holder clamping direction in a predetermined position of the substrate holder and releasing the substrate holder, comprising a substrate holder connection device for mechanical aligning and electrically contacting of the substrate holder. Further, the invention concerns an electrochemical treatment apparatus.

In the state of the art, electrochemical treatment apparatuses are known which comprise an anode which is immersed in an electrolytic fluid. An exchangeable substrate is carried by a substrate holder which is also exchangeable in the electrochemical treatment apparatus in order to treat another substrate. Via the substrate holder, electric current can be supplied to the substrate, wherein the electric current usually is supplied to the substrate holder from a substrate holder reception device of the electrochemical treatment of apparatus. Usually, because of short treatment times, very high current is supplied to the substrate via the substrate holder. The substrate is immersed in the electrolytic fluid and is arranged in a distance to the anode. Typically, the distance is a considerable part or a multiple of a lateral dimension of the substrate. Then, the alignment of the anode with the substrate does not have to be very precise. But if, for reasons of compactness and for reasons of a more effective treatment, the distance between the anode and the substrate is to be reduced, a higher precision of parallelism of the active anode and the substrate surface is required for uniform treatment results over the whole substrate. The applicant has found out that a considerable part of the precision of parallelism is determined by a reception process of a substrate holder in a substrate holder reception apparatus.

U.S. Pat. No. 5,522,975 A discloses a fixture for supporting a workpiece in a plating cell comprising a frame including a stem for removably positioning said frame into said plating cell, and a head, said frame head having a hole extending therethrough from front to back sides of said frame; a holder having a plateau on a front side thereof for supporting said workpiece adjacent to a perimeter thereof; said frame-head hole being complementary to said holder plateau and workpiece positionable thereon for receiving said plateau to align said workpiece with said frame front side therearound; and means for retaining said workpiece against said plateau.

JP 2007 291463 A discloses a method for plating an electronic circuit board wherein an electronic circuit board to be plated is attached to and held by the plating fixture and after the plating fixture is attached to a plating fixture conveying apparatus in the plating line, the resistance value of the electronic circuit board in the plating fixture is measured in the plating line, and that when the resultant measured value is equal to or below a preset resistance value, the plating is carried out and when the measured value is larger than the preset resistance value, the plating fixture is removed from the plating line.

EP 2 813 602 A1 discloses a holding device for a substrate holder for a vertical galvanic metal, preferably copper, deposition on a substrate to be treated comprising at least a first device element, at least a second device element and at least a third device element, wherein the first device element is a first fastening means for fastening the second and third device element; the second device element and the third device element are supporting elements, which are arranged in such a way that there is defined an at least semi-enclosed receiving hole for a substrate holder by the respective spacing between said second device element and said third device element, preferably defined by the respective spacing between first, second and third device element; wherein said second device element further comprise at least a first recess and said third device element further comprise at least a second recess for an accurate positioning and fixation of a substrate holder.

An objective of the present invention is therefore to provide a substrate holder reception apparatus which has an improved ability of aligning the substrate.

Subject matter of the invention is a substrate holder reception apparatus for clamping a substrate holder in a substrate holder clamping direction (SHCD) in a predetermined position of the substrate holder and releasing the substrate holder, which is characterized in that the substrate holder reception apparatus comprises a substrate holder clamping device configured to receive a substrate holder; wherein the substrate holder clamping device comprises at least one substrate holder connection device for mechanical aligning and electrically contacting of the substrate holder and at least one substrate holder clamping arm, wherein the substrate holder connection device, which is arranged at the end of a substrate holder clamping arm, comprises a separate substrate holder alignment device for aligning the substrate holder with the substrate holder connection device in an alignment direction, and a separate substrate holder contact device for electrically contacting the substrate holder; wherein the substrate holder reception apparatus is configured to first align the substrate holder and to afterwards bring the substrate holder contact device into contact with the substrate holder, in the clamping process; wherein when the substrate holder reception apparatus does not clamp a substrate holder, the substrate holder alignment device protrudes further towards a predetermined position of a substrate holder than the substrate holder contact device.

This is advantageous, because aligning the substrate holder relatively to the substrate holder reception apparatus and supplying current to the substrate holder from the substrate holder reception apparatus have different requirements to a connection area of the substrate holder and the substrate holder reception apparatus. For a good electrical contact between the substrate holder and the substrate holder reception apparatus, a high pressure in the contact area is advantageous. But the high forces which come along with the high contact pressure tend to quickly wear the alignment surface and thus to worsen the alignment. Therefore, wear is advantageously reduced by separation of an alignment surface from a connection surface. Wear is a problem not only because worn parts have to be replaced, but also debris from the wearing process can arrive at the electrolytic fluid and worsen a plating quality.

Further advantages by the improved alignment are to allow for a shorter distance between anode and the substrate which comes along with more intense material deposition and a more compact electrochemical treatment apparatus.

By splitting up the connecting process in two single processes in time, each process can take place without interference of the process and can deliver a better result. In detail, the alignment process can be finished with a good alignment first and afterwards; the contact process can take place wherein the position of the substrate holder is already determined by alignment which is therefore much less prone to contribute to a bad alignment.

It is a simple and efficient way to effect that the substrate holder alignment device first comes into contact with the substrate holder such that the alignment process can take place first.

The electrochemical treatment preferably is galvanic coating. A substrate can be a silicon substrate, preferably a wafer and most preferably a wafer with 300 mm in diameter. The substrate holder reception apparatus can be adapted to supply about 200 A of electric current per substrate.

Preferably, at the substrate holder, there is a counterpart for the substrate holder alignment device and a counterpart for the substrate holder contact device. The counterparts are preferably separate end sections of the substrate holder.

The subclaims concern preferable embodiments of the invention.

In a preferred embodiment, the substrate holder alignment device is arranged such that, in respect of a certain substrate holder, the substrate holder is preliminarily fixed to the substrate holder reception apparatus by form closure. Parts of the substrate holder alignment device and the substrate holder enclose each other. Preferably, the substrate holder is held in its predetermined position by gravity only. In a later step of receiving the substrate holder in the substrate holder reception apparatus, the substrate holder can be fixed by force closure, additionally, which is advantageous for good electrical contact.

Preferably, the substrate holder alignment device and the substrate holder contact device are arranged over an electrolyte basin and, preferably over a position of the electrolyte basin where electrolytic fluid flows away from the substrate and preferably out of the electrolyte basin.

In a further embodiment, the substrate holder reception apparatus comprises two substrate holder connection devices. Preferably, the substrate holder connection devices are arranged at opposite ends at the position which is predetermined for the substrate holder. In an alternative, it is also possible to clamp the substrate holder from one side only. In this case, in the clamping process the substrate holder is preferably pressed against an abutment at the substrate holder clamping device with its opposite end in regard of an end which is connected to the substrate holder connection device. However, the use of two active substrate holder connection devices is preferred.

In a further embodiment, the substrate holder alignment device is movable towards a substrate holder by clamping action of a substrate holder clamping mechanism and is supported by an alignment device spring arrangement. The alignment device spring arrangement can elastically be reduced in length when the substrate holder alignment device touches the substrate holder and the substrate holder clamping mechanism exerts a clamping force on the substrate holder alignment device. In this way, the forces are restricted and augmented slowly in the clamping process. This leads to a slow but precise orientation of the substrate holder relative to the substrate holder alignment device. Further, this enables to first bring the substrate holder alignment device into contact with the substrate holder and, by continuing the clamping movement, after a certain compression way of the alignment device spring arrangement, to bring the substrate holder contact device into contact with the substrate holder.

In a further embodiment, the substrate holder connection device comprises a connection balance which is, as a whole, movable towards a substrate holder by the substrate holder clamping mechanism. To this end, the connection balance is preferably connected mechanically to a clamping arm of the clamping mechanism which is configured to move towards the substrate holder. The connection balance supports the substrate holder alignment device at a first connection balance lever and the substrate holder contact device at a second connection balance lever. Preferably, between the first connection balance lever and the substrate holder alignment device, the alignment device spring arrangement is arranged.

The connection balance allows compensation of dimensional tolerances of the position of the place of electrical contracting of the substrate holder. Though there might be arranged no spring between the connection balance and the substrate holder contact device, the movability of her connection balance allows adapting the position of the substrate holder contact device to the position of the place of electrical contracting of the substrate holder. Further, by the length of the balance levers, the portion of the clamping force can be distributed under the alignment and the contact function. The longer the lever is, the less the force is.

In a further embodiment, the substrate holder alignment device and/or the substrate holder contact device is movable by at least one, preferably two, substrate holder clamping arms. These substrate holder clamping arms can be made of fibre-reinforced plastic material, for example carbon or glass fibre-reinforced plastic material or a thin metal material. The bending stiffness of the substrate holder clamping arms is preferably chosen such that a significant bending of the substrate holder clamping arms takes place in the clamping process, preferably throughout the whole clamping process. In this way, the increase of the clamping forces can be slowed and can be more distributed along a clamping movement, in comparison with stiff substrate holder clamping arms. Too high clamping forces can be avoided in this way. This is called an elastic effect in this application. The substrate holder clamping arms are preferably arranged at an angle, more preferably perpendicularly, to the substrate holder clamping direction.

In a further embodiment, a substrate holder alignment device has at least one alignment surface wherein the one or more alignment surfaces comprising at least two alignment surface sections which are arranged in a distance to each other. The alignment surface sections each have a concave or convex shape with a protrusion or a recess in a substrate holder clamping direction which is directed from the alignment surface to the substrate holder.

It is proposed to use two recesses and/or protrusions in order to align the substrate holder in regard of a distance line between the recesses and/or protrusions, wherein a recess and protrusion associated to each other, respectively. This leaves a degree of freedom in swivelling of the substrate holder around this distance line. The two recesses and/or protrusions can be parts of one single alignment surface. They can also for example have the form of a ridge or a groove. Such a ridge or groove preferably touches its counterpart at the substrate holder along one or two lines. Preferably, a ridge or counter groove has different shapes and/or radii and/or wedge angles such that the contact of counterparts substantially has the form of one or two lines.

The protrusion and/or the recesses can have flanks which are arranged at an angle greater than 1° and less than 89° to the substrate holder clamping direction, such that they for example have the form of letter V, the tip of which can also have a radius. The flanks can have a wedge effect for a counterpart which can be received between the flanks. By the wedge effect, a precise positioning of the protrusions and/or the recesses relative to their counterparts is possible. Then, two contact lines can occur between the substrate holder alignment device and the substrate holder. Alternatively, instead of a wedge effect from flanks, the orientation along the bottom of a groove can be used for alignment. Then, a single contact line can occur between the substrate holder alignment device and the substrate holder. This can for example be the case when the protrusion has a radius at its end which preferably has the form of a half circle. In case that such a radius is smaller than the radius of the counter recess, a line contact can occur. In an example, the radius of the protrusion and the radius of the counter recess are equal or similar such that a contact area occurs that covers a significant part of the protrusion tip, for instance more than 25% of it. In this way, a significant electrical current can be transferred also by the substrate holder alignment device. It is also possible to use other geometries of the protrusion and/or the recess, for example a, elliptical or oval surface, or a polygonal surface, wherein preferably the edges are chamfered of most preferably rounded to minimize debris In order to align the substrate holder in regard of the substrate holder reception apparatus in a further degree of freedom, a second substrate holder alignment device of the substrate holder reception apparatus comprises at least one alignment surface comprising at least one alignment surface section, wherein the alignment surface section has a concave or convex shape with a protrusion or a recess in direction to the substrate holder as described above. The protrusion or the recess can have two flanks which are arranged obliquely to the substrate holder direction. In this way, the flanks can receive a counterpart which is positioned relatively to the flanks with high precision. Also a contact at one single line can be realised as described above.

The flanks of one, more than one or all of the above-mentioned protrusions or recess can for example have a form of hollow or a solid radius or wedge. The counterpart is arranged at the substrate holder.

Preferably, the parallelism between the substrate and the anode shall deviate less than 2.5 mm, preferably less than 1.5 mm. As the dimensions of the alignment surface and particularly the distance between the alignments surface sections is only a small part of the dimensions of the substrate holder and the substrate, respectively, the accuracy of the alignment between the substrate holder reception apparatus and the substrate holder has to be better by a factor which corresponds to the relationship of the dimensions of the alignment surface and the substrate holder. This factor preferably might be between 3 and 15. The alignment accuracy between the substrate holder alignment device and the substrate holder is preferably better than 0.5 mm and most preferably better than 0.05 mm. As a high accuracy is expensive, the accuracy can also be between 0.1 and 0.05 mm.

In a further embodiment, the substrate holder contact device has a plane contact surface which is oriented perpendicular to the substrate holder direction. With such an orientation, few or no forces one of the substrate holder alignment device are exerted by substrate holder contact device. Therefore, alignment is not deteriorated by electrically contacting the substrate holder.

In a further embodiment, the substrate holder alignment device is configured to transfer electric current to the substrate. If the contact area between the substrate holder alignment device and the substrate holder is smaller than at the substrate holder contact device, preferably less current is transferred to the substrate holder in comparison to the substrate holder contact device. There are substrate holders which can carry two substrates, wherein one substrate is connected to the substrate holder alignment device and one is connected to substrate holder clamping device for transferring electric current.

In a further embodiment, the substrate holder reception apparatus comprises a substrate holder clamping device with a substrate holder clamping mechanism which comprises a guide mechanism with a guide element which is preferably a guide rod and a guide bearing for guiding the guide element, wherein the guide element is moveable to clamp the substrate holder. The substrate holder clamping device can be mounted on a substrate holder movement device which is configured to move the substrate holder clamping device. A fastening device can be provided in the substrate holder clamping device for fastening it to the substrate holder movement device. The fastening device comprises a fastening device bearing, which is arranged to guide the guide element in order to enable a relative movement between the substrate holder clamping device and the fastening device which can be fastened to the substrate holder movement device. In this way, the guide element has a double use, namely for effecting the clamping and for relative movements between the substrate holder movement device and the substrate holder clamping device except in the fastening device which is attached to the substrate holder movement device.

Preferably, the substrate holder clamping mechanisms comprises two clamping arms which are each mechanically connected to a guide element which can comprise two parallel guide rods. These guide elements preferably move in opposite directions when clamping and releasing the substrate holder with the clamping arms. In case that the substrate holder movement device moves the substrate holder clamping device, no relative movement between the two guide elements take place. Instead, the fastening device moves along at least one, preferably both guide elements with at least one fastening device bearing. Preferably, the guide bearing and the fastening device bearing can be used with the same guide element and are preferably of the same type.

In a further embodiment, the substrate holder clamping device can be separated from the substrate holder movement device as a unit when unfastening the fastening device from the substrate holder movement device.

In a further embodiment, the substrate holder reception apparatus comprises a substrate holder clamping device with a substrate holder connection device and comprises a substrate holder movement device for moving the substrate holder clamping device in two different directions, namely preferably up and down which is called the y-axis direction and, preferably perpendicularly thereto, to the left and the right side which is called the x-axis direction.

The substrate holder movement device comprises a stationary movement device frame, an x-axis drive having an x-axis drive device and a y-axis drive having a y-axis drive device. The x-axis drive device and the y-axis drive device are mechanically fixed to the movement device frame that such that the x-axis drive device and the y-axis drive device are stationary regarding movements they effect at the substrate holder clamping device. A first one of the drive devices is arranged between the movement device frame and the substrate holder clamping device, and a second one of the drive devices is arranged between the movement device frame and an intermediate frame which, for compensation of movements of the first drive device, is mechanically connected to the substrate holder clamping device via an intermediate frame guide. Preferably, the drive device that is connected to the intermediate frame is the x-axis drive. Then, the x-axis movement can be effected via the intermediate frame to the substrate holder clamping device, wherein the y-axis movement of the substrate holder clamping device is compensated by the intermediate frame guide. An advantage of this embodiment is that force generation units of both drive devices such as electric motors or hydraulic cylinders or pneumatic cylinders are not moved by their own action and remain stationary. Therefore, also their cables are not bent and will less probably fail such that also total operation failure probability is decreased.

In a further embodiment, an arm spreading device is proposed with which the substrate holder can be released when the substrate holder clamping arms are spread away from each other or clamped when the substrate holder clamping arms are moved towards each other. Preferably, the arm spreading device is operated to spread the arms by running a part of it against a stopper using one of the x-axis drive or the y-axis drive. Preferably, the x-axis drive is used because its guides are preferably arranged at the substrate holder clamping device such that the arm spreading device can be integrated into substrate holder clamping device, also, to form a single unit which can easily be separated from the substrate holder movement device. The arm spreading device can be spring loaded to clamp the substrate holder. The spring force can be eliminated for clamping by running the arm spreading device against the stopper, wherein the stopper bears the spring force instead of the substrate holder clamping mechanism. The arm spreading mechanism can use the guides of the substrate holder clamping arms and/or the x-axis guides for clamping and releasing the substrate holder. For instance, an arm spreading device comprising a stopper and a spring loaded arm spreading actuation bar, which is configured to move guide rods for a movement of a substrate holder clamping arm when the arm spreading device is actuated by running against a stopper. The stopper is preferably fixed to the substrate holder movement device.

In a further aspect of the invention, an electrochemical treatment apparatus for treating a substrate which acts as cathode in an electrolytic fluid is proposed. The electrochemical treatment apparatus comprises an anode and a substrate holder reception apparatus according to the invention. The anode can be plane, preferably if a plane surface of a substrate is treated. An active surface of the anode which is in electrical contact with the electrolytic fluid is, in operation, directed to the substrate. The anode preferably has a distance to the cathode of less than 50 mm, most preferably between 20 and 35 mm. With such a small distance, a current can be used for the electrochemical treatment.

In an embodiment of the electrochemical treatment apparatus, the substrate has a plane treatment surface. In operation, a parallelism deviation of the treatment surface in regard to the active surface of the anode less than 2.5 mm, and preferably less than 1.5 mm. This is advantageous in order to achieve a small distance between the anode and the substrate and to still achieve a good uniformity of treatment.

In a further embodiment of the electrochemical treatment apparatus, the electrochemical treatment apparatus comprises two anodes. The anodes are arranged and directed opposite to each other in regard of an active surface for electrochemical treatment. In operation, a substrate is arrangeable between the anodes to be electrochemically treated. It is preferred that the anodes have the same electrical potential. Preferably, the active areas are plane areas. The substrate can be a wafer. The substrate preferably has a thickness between 100 µm and 400 µm. A distance between the anodes is for example less than 50 mm and preferably about 35 mm. In this case, a constant thickness of a layer which is for instance generated by electroplating can be achieved. A distance around 35 m is a good compromise between alignment accuracy which tends to be expensive and good thickness constancy.

In a further embodiment of the electrochemical treatment of apparatus, the substrate holder connection device, in operation of the substrate holder reception apparatus, is arranged above the liquid level of the electrolytic fluid. Because of the high accuracy of the alignment, the substrate holder connection device can be arranged in this exposed position from which the substrate all those protruding into the electrolytic fluid and still, sufficient accuracy of position and parallelism of the substrate relative to the anode is possible.

In further aspect of the invention, a substrate holder for use in a substrate holder reception apparatus according to one of the above-mentioned embodiments is proposed. The substrate holder has at least one alignment device reception area and a contact device reception area which is configured to lead electric current to the substrate. The alignment device reception area is locally separated from the contact device reception area which corresponds to the separation of the substrate holder alignment device and the substrate holder contact device.

In a further embodiment of the substrate holder, the alignment device reception area is formed at least partially as an alignment counter surface for the alignment surface sections which have the form of a recess or a protrusion extending in the substrate holder clamping direction such that the substrate holder and the substrate holder connection device are alignable with each other.

In a further embodiment, the substrate holder reception apparatus, the substrate holder, the electrochemical treatment apparatus, or combinations thereof provide means for conducting warmth away from the substrate holder reception apparatus. Such means are preferably selected from active cooling devices, passive cooling devices or combinations thereof, wherein optional cooling devices of the substrate holder are preferably selected from passive cooling devices. For example, an active cooling device can provide a gas stream or fluid stream like a cooling fluid stream directly or indirectly coming in contact with a part of the substrate holder reception apparatus or the substrate holder being heated up during processing a substrate. For example, such passive cooling device can be selected from cooling fins preferably made from metal being attached to the substrate holder reception apparatus, the substrate holder, or both. Such attachment to the substrate holder reception apparatus, the substrate holder or both can be permanent or only during the treatment of the substrate.

In a further embodiment, the substrate holder reception apparatus, the electrochemical treatment apparatus, or both provide at least one active cooling device. Herein, an active cooling device using a gas stream is preferred for certain embodiments. Such type of cooling device is a simple and efficient possibility to conduct lower amounts of warmth of away from parts of the substrate holder reception apparatus heating up during processing. For other embodiments it is preferred using an active device based on a fluid stream. Such cooling device proved to be beneficial to conduct higher amounts of warmth away from the substrate holder reception apparatus.

In a further embodiment, the substrate holder reception apparatus, the substrate holder, the electrochemical treatment apparatus, or combinations thereof, more preferred the substrate holder reception apparatus, the substrate holder, or both, provide a passive cooling device. Preferably, such passive cooling device is attached to the substrate holder reception apparatus, the substrate holder, or both and not only brought into contact during processing the substrate. It was noted that such arrangement provided an increased ability to conduct warmth away from the substrate holder reception apparatus. A preferred type of a passive cooling device is a cooling fin.

In a further embodiment, the substrate holder reception apparatus, the substrate holder, the electrochemical treatment apparatus, or combinations thereof provide a combination of an active cooling device and a passive cooling device. For example, it proved to be especially useful to combine an active cooling device located in the substrate holder reception apparatus, the electrochemical treatment apparatus, or both with a passive cooling device like a cooling fin attached to the substrate holder reception device, the substrate holder, or both. Such combination typically provided an increased cooling with a lower amount of energy required for the active cooling device.

Figure 2:
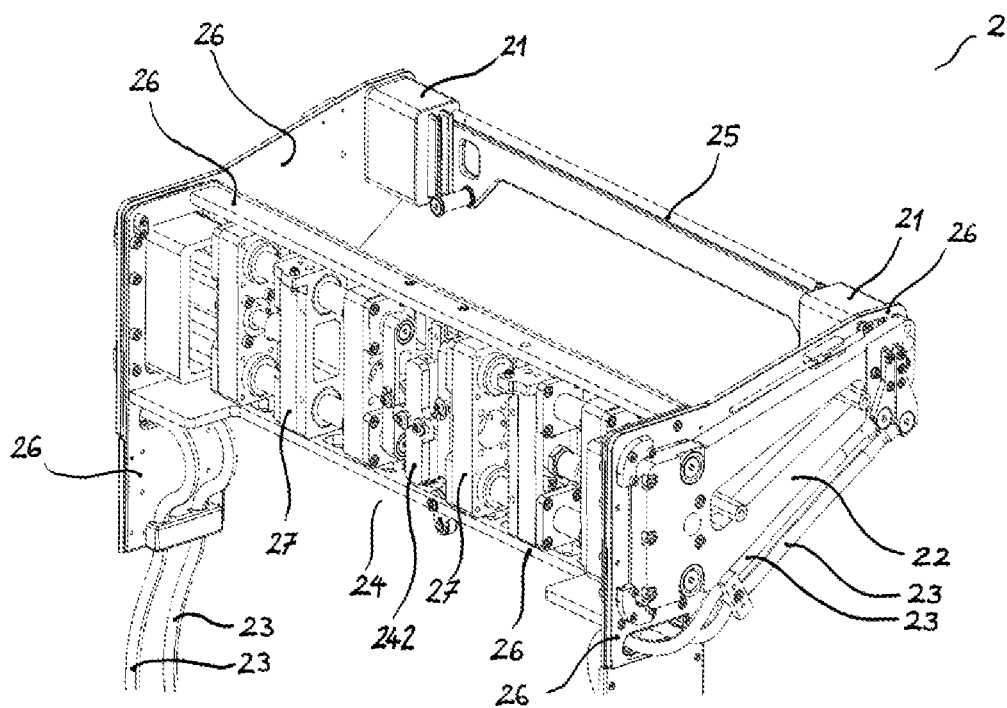
Figure 3:
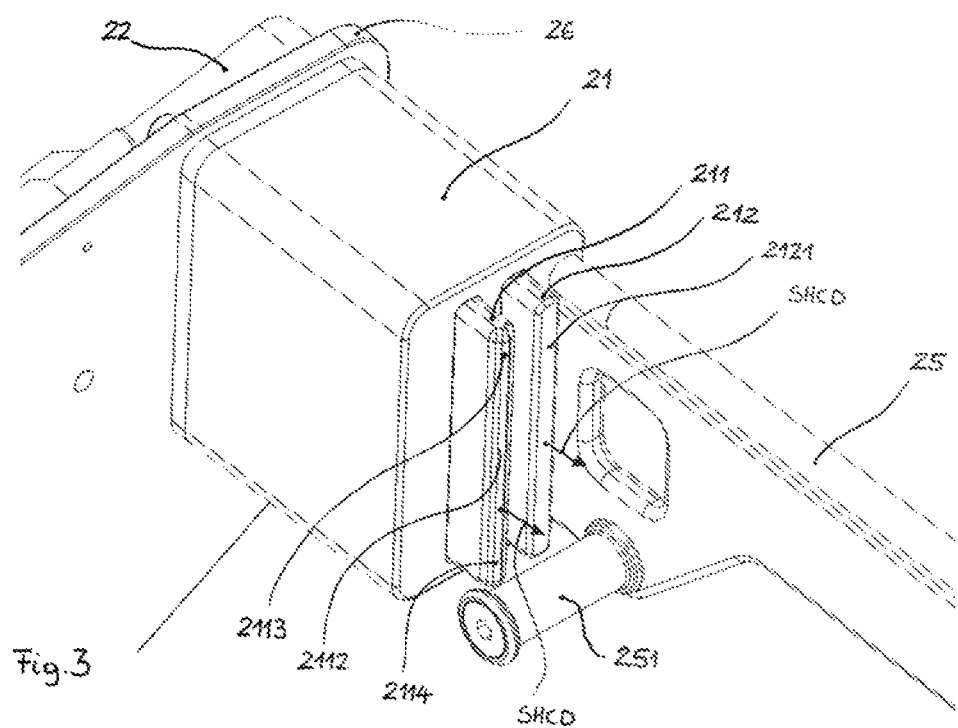
Figure 4:
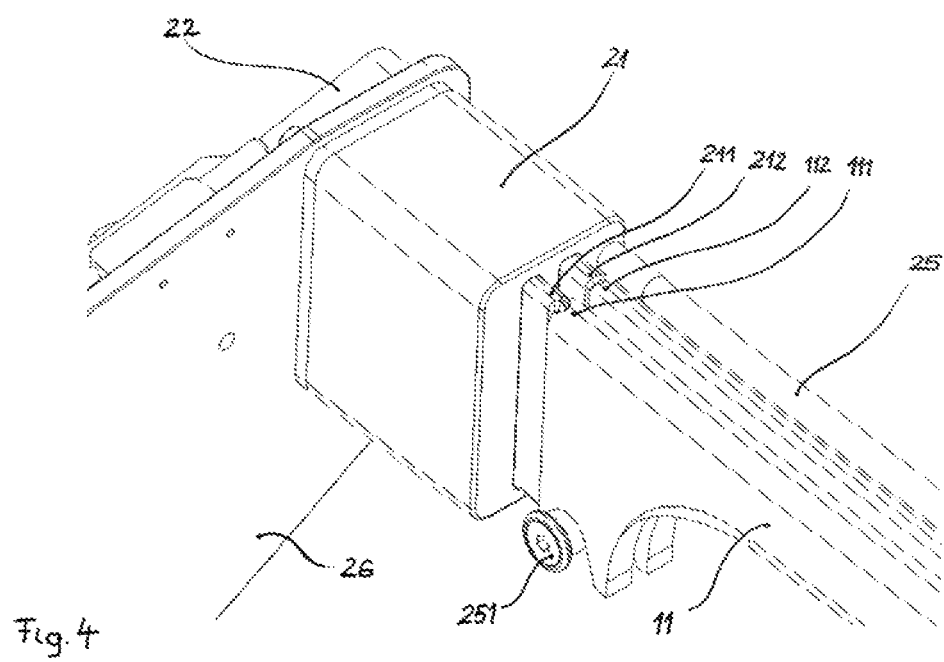
Figure 5:
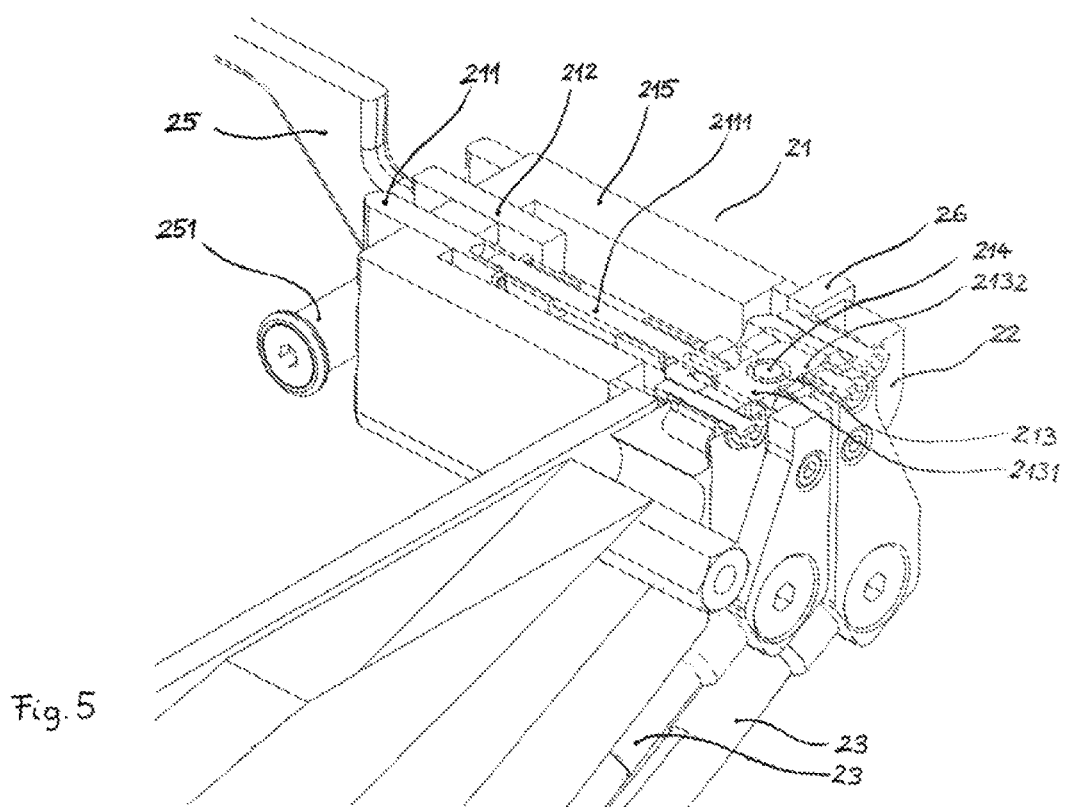
Figure 6:
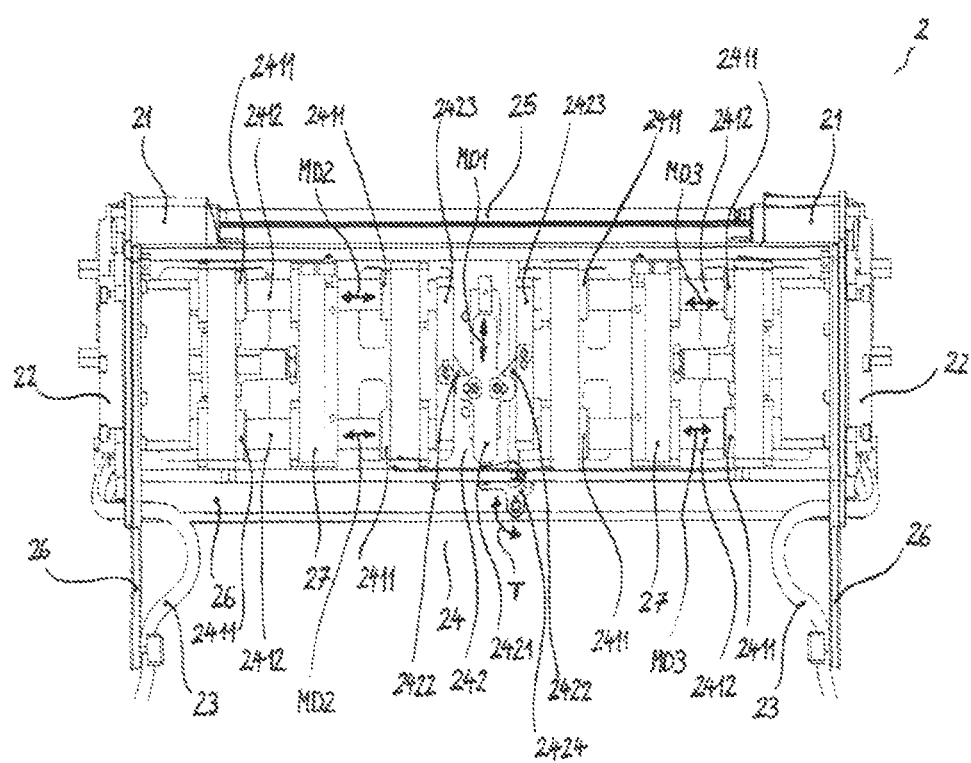
Figure 7:
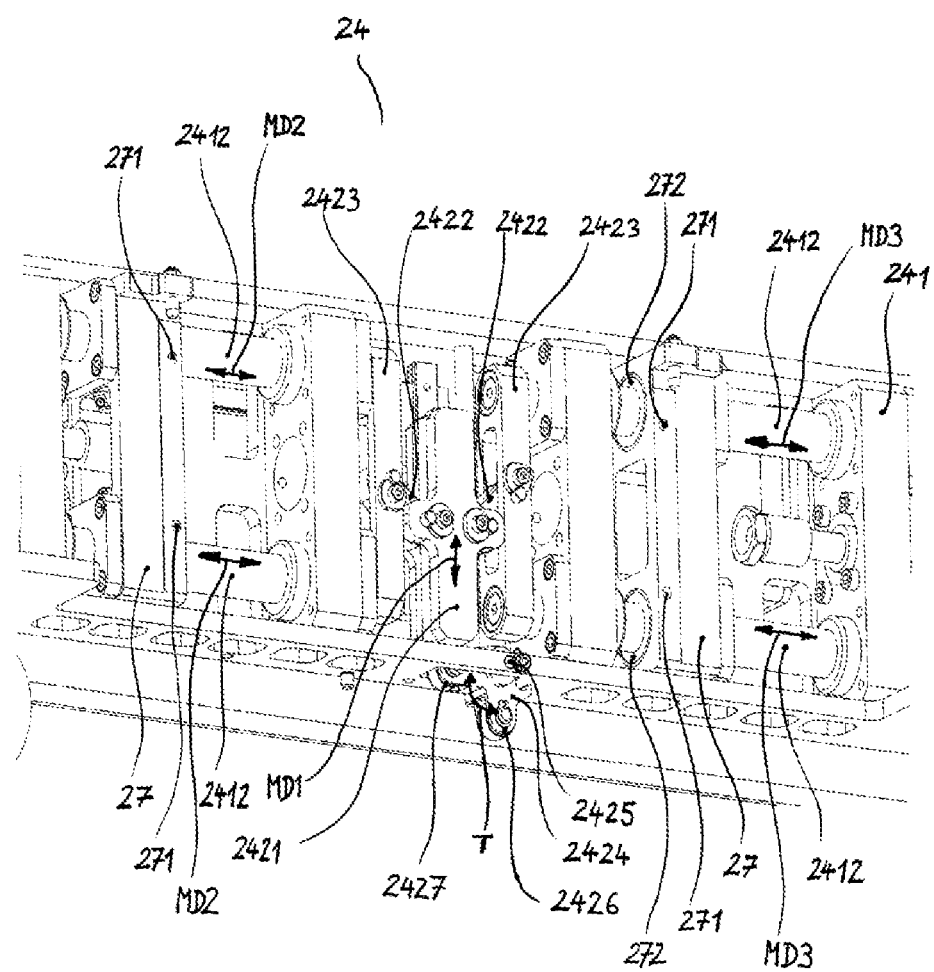
Figure 8:
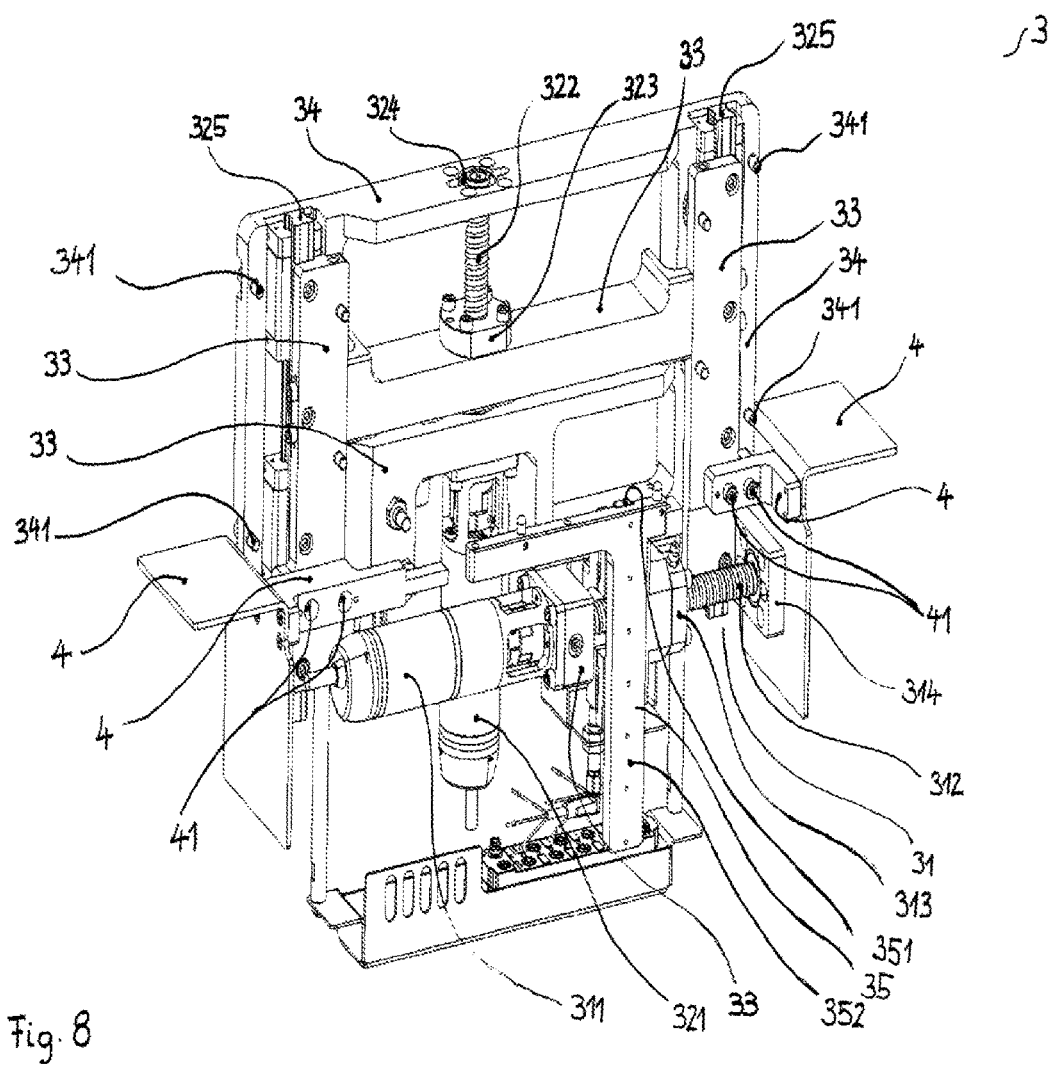
Figure 9:
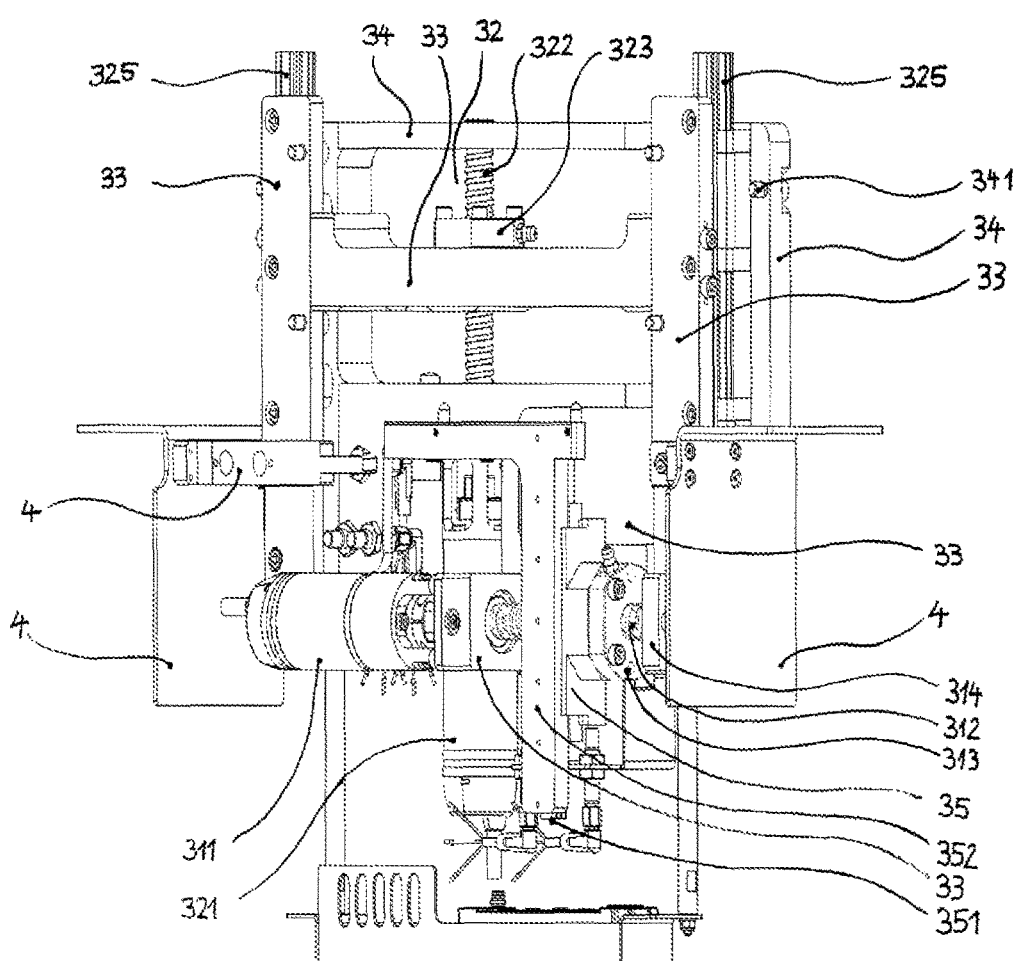
Figure 10:
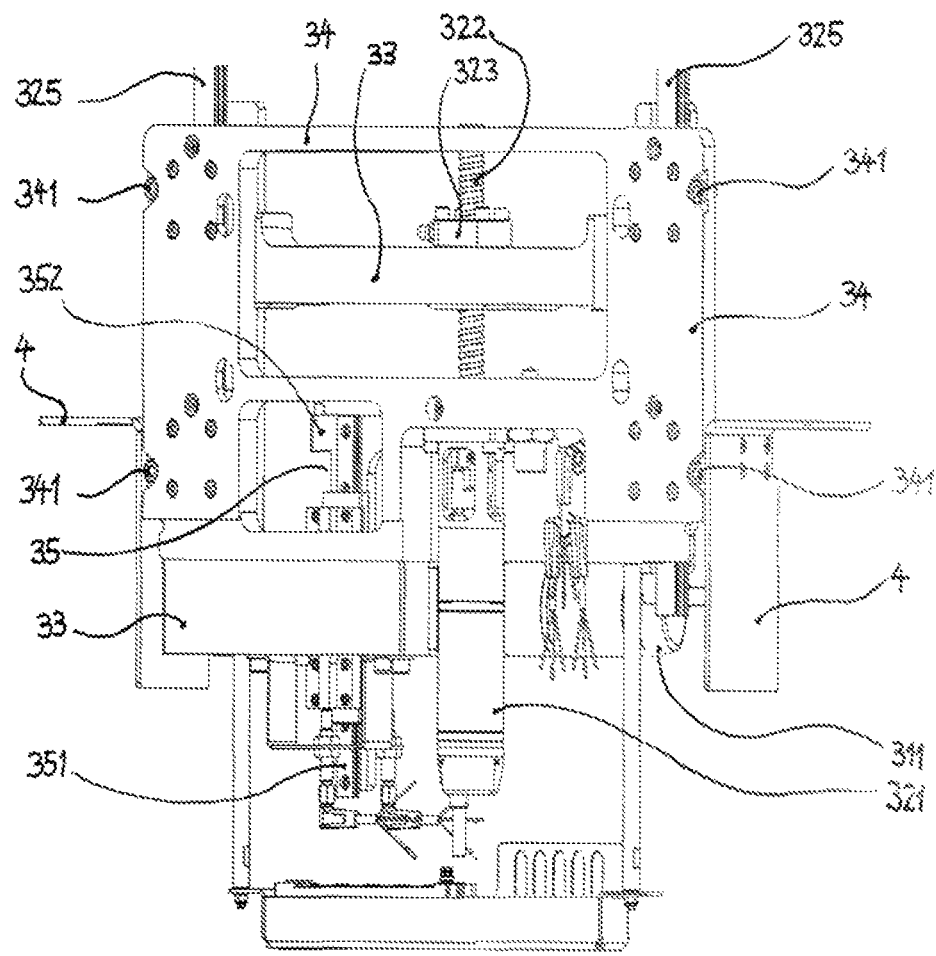
Figure 11:
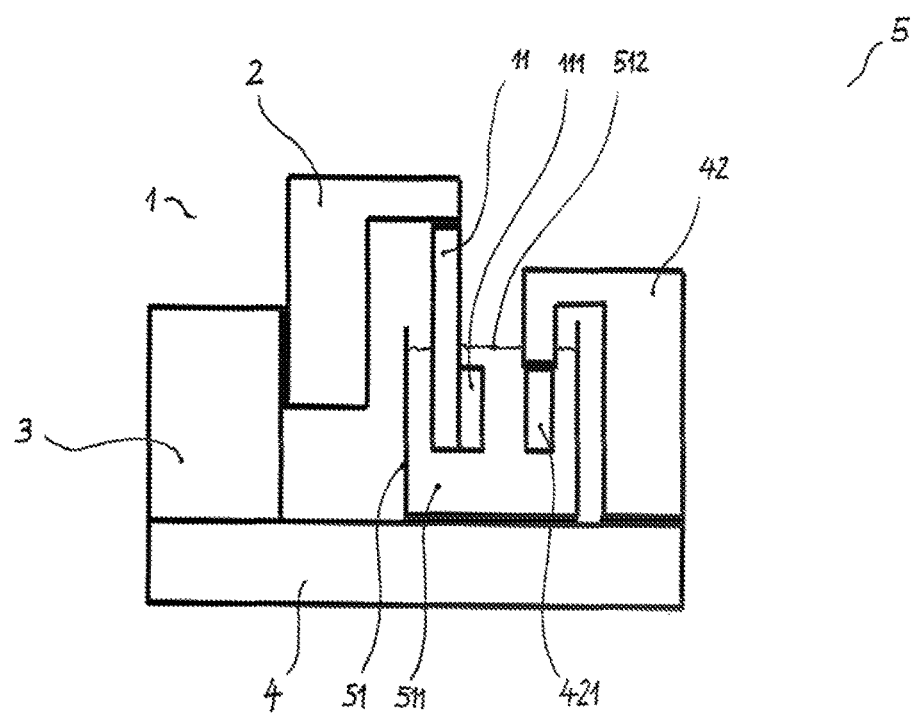

An embodiment of the invention is shown, as an example only, in the attached figures, in which FIG. 1 shows in a perspective view a substrate holder reception apparatus, FIG. 2 shows in a perspective view a substrate holder clamping device of the substrate holder reception apparatus, FIG. 3 shows in a perspective view a substrate holder connection device of the substrate holder clamping device, FIG. 4 shows the view of FIG. 3 in which additionally, substrate holder ends are shown, FIG. 5 shows in a perspective view a cut through the substrate holder connection device, FIG. 6 shows in a non-perspective view a substrate holder clamping apparatus, in which a substrate holder clamping mechanism is visible, FIG. 7 shows in a perspective view a part of the substrate holder clamping mechanism of FIG. 6, FIG. 8 shows in a perspective view a substrate holder movement device, FIG. 9 shows in another perspective view the substrate holder movement device of FIG. 8, FIG. 10 shows in yet another perspective view the substrate holder movement device of FIG. 8, and FIG. 11 shows a schematic view of an electrochemical treatment apparatus.

FIG. 1 shows a substrate holder reception apparatus 1 of an apparatus for a wet-chemical or electrochemical treatment of a flat material. The substrate holder reception apparatus 1 comprises a substrate holder clamping device 2 that is configured to receive a substrate holder which is not shown in FIG. 1, and a substrate holder movement device 3. To the substrate holder, a substrate is attachable. The substrate holder is configured to supply electric current to the substrate, wherein the substrate acts as a cathode in the treatment process.

The substrate holder movement device 3 can be fixed directly or indirectly to a machine base which is not shown in FIG. 1. Also, an anode can be fixed to the machine base or is mechanically connected to the substrate holder reception apparatus 1 in another way. The substrate holder movement device 3 is configured to move the substrate relatively to the anode which is not shown in FIG. 1, in a direction parallel to an anode surface. The anode surface is preferably even and is, during treatment, directed to the substrate. A treated surface of the substrate is aligned substantially parallel to the anode surface during treatment. In order to connect the substrate holder to the substrate holder reception apparatus 1, the substrate holder clamping device 2 comprises two substrate holder connection devices 21 between which the substrate holder can be arranged. The substrate holder connection devices 21 each are arranged at the end of a substrate holder clamping arm 22. The substrate holder connection devices 21 are also each supported by a protruding part of a clamping device frame 26 each of which is parallel one of the substrate holder clamping arms 22. Each of the substrate holder connection devices 21 can in operation be supplied with electric current by current supply cables 23. The current supply cables 23 to each substrate holder connection device 21 supply the same electrical potential to their substrate holder connection device 21. Between the substrate holder connection devices 21, a frame bridge 25 is arranged. The substrate holder connection device 21, in turn, comprises a substrate holder alignment device 211 which is configured to align a substrate holder relatively to the substrate holder connection device 21. The substrate holder alignment device 211 and the substrate holder reception apparatus 1 as well as the relative mechanical connection pathway between the substrate holder reception apparatus 1 and the anode are configured to align a treated surface of a substrate substantially parallel to the flat anode surface. Further, the substrate holder connection device 21 comprises a substrate holder contact device 212 which is configured to supply current to the substrate holder. The current flows to the substrate via the substrate holder.

FIG. 2 shows in a perspective view a substrate holder clamping device 2. Additionally to the features of the substrate holder clamping device 2 that have been described in regard of FIG. 1, in FIG. 2 a substrate holder clamping mechanism 24 is visible. The clamping device frame 26, of which only parts are visible, also supports the substrate holder clamping mechanism 24.

The substrate holder clamping device 2 comprises two fastening devices 27 at which the substrate holder clamping device 2 can be fastened to the substrate holder movement device 3. The substrate holder clamping mechanism 24 comprises an arm spreading device 242 with which a distance between the arms 22 can be changed to clamp and release the substrate holder. By the substrate holder clamping mechanism 24, the substrate holder alignment device 211 and the substrate holder contacting device 212 are retracted from the substrate holder and into the substrate holder connection device 21 and driven out of it, respectively, to disconnect and connect the substrate holder, respectively.

FIG. 3 shows in a perspective view the substrate holder connection device 21 and its neighbouring parts. The body of the substrate holder connection device 21 is mechanical connected to the clamping device frame 26. The substrate holder alignment device 211 and the substrate holder contact device 212 protrude from the body of the substrate holder connection device 21 and are mechanically connected to the substrate holder clamping arm 22 and can be retracted and driven outward by movement of the substrate holder clamping arm 22. The substrate holder contact device 212 comprises a contact surface 2121 which is substantially plane and which is directed to the substrate although which is not visible in FIG. 3.

The substrate holder alignment device 211 comprises an alignment surface 2112 which has a cross section with a radius at the tip of the ridge formed alignment surface 2112. On the alignment surface 2112, a first and a second alignment surface section 2113 and 2114 are defined, because in principle, it is possible to omit the part of the surface between the first and a second alignment surface section 2113 and 2114. The contact surface can be pressed against the substrate holder in order to generate a contact with low electrical resistance. A counter surface of the substrate holder for the contact surface 2121 also is substantially plane and located on the substrate holder to make contact with the contact surface 2121.

FIG. 4 shows the same perspective view as FIG. 3 with the difference that also a substrate holder 11 is shown. The substrate holder 11 is supported by a pin formed substrate holder support 251. The substrate holder support 251 is fixed to the frame bridge 25. The substrate holder has two separate ends, an alignment end 111 and a contact end 112 which are visible in FIG. 4. The alignment end 111 is associated to the substrate holder alignment device 211 and comprises a groove into which the substrate holder alignment device 211 protrudes. The groove extends along the rim of the alignment end 111. A mechanical alignment is achieved by the form of the groove at the end of substrate holder alignment device 211 which reduces in width towards the end. In contrast, the contact end 112 of the substrate holder 11 has a flat end against which the substrate holder contact device 212 is pressed in the clamped state of the substrate holder 11. When the substrate is supplied with electric current, it can, in one example version, mainly flow from the substrate holder contact device 212 to the contact end 112 of the substrate holder 11 because this connection has a fewer electrical resistance than the connection between the substrate holder alignment device 111 and the alignment end 111 of the substrate holder 11. The latter preferably have contact at one or two lines only which improves the precision of alignment but increases the electrical resistance of the connection. Preferably, a radius of the groove of the alignment end of the substrate holder 11 differs from a radius at the end of the substrate holder alignment device 211. In this way, not the complete areas touch, but only one or two lines which improve the alignment. So, the functions of alignment and electrical contact are distributed to the two ends 111 and 112 and the corresponding substrate holder alignment device 211 and the substrate holder contact device 212, respectively. Alternatively, the cross-section form of the tip of the substrate holder alignment device can match the cross-section form of the corresponding end of the substrate holder. The ends can have the same radii, for example. Then, a current can flow over the connection between the substrate holder alignment device and the substrate holder which is comparable to the current of the connection between the substrate holder contact device and the substrate holder FIG. 5 shows a cut through a substrate holder connection device 21 in a perspective view. The substrate holder connection device 21 comprises a housing 215 which is connected to the clamping device frame 26. Through the housing 215, the substrate holder alignment device 211 and the substrate holder contact device 212 protrude towards the substrate holder which is not shown in FIG. 5. The substrate holder alignment device 211 and the substrate holder contact device 212 can be moved through slots in the housing 215 such that they are retracted or driven outward. This happens in the clamping process, in which the clamping arm 22 is moved relatively to the clamping device frame 26 towards the substrate holder or away from it. Through the inside of the housing 215, the substrate holder alignment device 211 and the substrate holder contact device 212 are connected to the substrate holder clamping arm 22 via a connection balance axis 214 which is attached to the clamping arm 22. The connection balance axis 214 carries a connection balance 213. The connection balance supports, in direction of the substrate holder, the substrate holder alignment device 211 by a first connection balance lever 2131 and the substrate holder contact device 212 by a second connection balance lever 2132. The support to the substrate holder alignment device 211 is realised via an alignment device spring arrangement 2111 which enables to expand and reduce the distance between the connection balance 213 and the tip of the substrate holder alignment device 211 which has a reducing cross-section area in direction to the predetermined position of the substrate holder. In a non-clamping state of the substrate holder connection device 21, the tip of the substrate holder alignment device 211 protrudes preferably further in direction to the substrate holder as the substrate holder contact device 212. In the clamping process, the substrate holder alignment device 211 can come, in one example version, into contact with the substrate holder before the substrate holder contact device 212 does. In this case, alignment can happen before the main electrical contact is made. Then, the alignment is not impeded by the substrate holder contact device 212, and the alignment becomes very precise. In this version, once the substrate holder alignment device 211 comes into contact with the substrate holder, the clamping process continues by further movement of the clamping arm 22 towards the substrate holder, wherein the alignment device spring arrangement 2111 is compressed. The connection balance 213 is turned about the connection balance axis 214 in giving way to the forces from the substrate holder alignment device 211 which is pressing against the substrate holder. Eventually, also the substrate holder contact device 212 comes into contact with the substrate holder. Then, a counterforce occurs at the connection balance 213 by the connection of the substrate holder contact device 212 to the connection balance, wherein the connection is not explicitly shown in FIG. 5. The substrate holder contact device 212 can be less resilient as the alignment device spring arrangement 2111, higher clamping forces occur when the clamping movement is continued. The connection balance 213 effects that the same forces occur at the substrate holder alignment device 211 and the substrate holder contact device 212.

The connection balance 213 further effects that differences in the length of the substrate holder can be compensated for, wherein the full force of the clamping arm 22 is not exerted on the substrate holder. This is possible by the combination of the contact balance 213 and the arrangement is device spring arrangement 2111. These processes occur at both substrate holder connection devices 21 at both sides of the substrate holder.

FIG. 6 shows in a schematic view the substrate holder connection device 2, in which the substrate holder clamping mechanism 24 is visible. The substrate holder clamping mechanism 24 comprises the substrate holder clamping arms 22 which are arranged at opposing sides of the substrate holder clamping device 2. The substrate holder clamping mechanism 24 is mainly arranged at the substrate holder clamping device on a side which is opposite to the side of the substrate holder clamping device 2 at which the substrate holder can be clamped.

The clamping arms 22 can be moved by a guide mechanism 241 comprising guide rods 2412. For each clamping arm 22, two parallel guide rods 2412 are provided. Each guide rod 2412 is supported by two guide bearings 2411. The guide bearings 2411 are mechanically connected to the clamping device frame 26. Opening and closing of the substrate holder clamping arms 22 can be effected by an arm spreading device 242. The arm spreading device 242 comprises an arm spreading actuation bar 2421 which is connected to each of the substrate holder clamping arms 22 via an angular lever 2424, a guide rod bridge 2423 and two guide rods 2412. The movement direction MD1 of the arm spreading device 242 is arranged perpendicular to the movement directions MD2, MD3 of the guide rods 2412. The arm spreading actuation levers 2422 each extend obliquely between one guide rod bridge 2423 and the arm spreading actuation bar 2421 and are each connected pivotably to both the guide rod bridge 2423 and the arm spreading actuation bar 2421. An angular movement of the arm spreading actuation bar 2421 along a movement direction MD1 is transformed in a movement of the guide rod bridges 2423, the guide rods 2412 and the clamping arms 22 by this construction. The movement direction MD2 of the clamping arm 22 which is shown on the left side in FIG. 6 and the movement direction MD3 of the clamping arm 22 on the right side in FIG. 6 can go to the left and to the right as is shown by the arrows. Movements of the guide rods 2412 and the clamping arm 22 along the movement directions MD2 and MD3 are opposed to each other when the arm spreading device 242 is active. The movements are substantially synchronous to each other such that the clamping rods 22 open and close at both sides at the same time. The movements of the guide rods 2412 take place relative to the guide bearings 2411.

FIG. 7 shows in a perspective view the substrate holder clamping mechanism 24 with the guidance mechanism 241 and the arm spreading device 242. FIG. 7 also shows two fastening devices 27 for fastening the substrate holder clamping device 2 to the substrate holder movement device 3 which is not shown in FIG. 7. As shown in FIG. 7, the substrate holder clamping device 2 can be connected to the substrate holder movement device 3 by screws, for example four screws as is shown by four fastening holes 271 in the fastening device 27 which are threaded. One fastening device 27 is arranged, in FIG. 7, at the left side and the other one at the right side of the substrate holder clamping mechanism 24. The fastening devices 27 each are movable along two parallel guide rods 2412. To this end, each fastening device 27 comprises two fastening device rod bearings 272. When the fastening devices 27 are attached at the substrate holder movement device 3, the substrate holder clamping device 2 can be moved as a whole unit except the fastening devices 27, to the left and the right in FIG. 7 and along the movement directions MD 2 and MD3. To effect this movement, a relative movement between the fastening devices 27 and the clamping device frame 26 can be effected by the substrate holder movement device 3 which is also mechanically connected to the clamping device frame 26. When the substrate holder clamping mechanism 24 is moved, the fastening devices 27 move along their respective guidance rods 2412 in parallel. In this way, the guide rods 2412 move relatively to the fastening device rod bearings 272.

The movement of the arm spreading device 242 can be effected by an angular lever 2424 which can turn about an angular lever axis 2425 in a turning direction T. A first lever section 2426 of the angular lever 2424 that protrudes downwards in FIG. 7 can run against a stopper which is not shown in FIG. 7, when the whole substrate holder clamping device 2 is moved in direction of the guide rods 2412 and in movement directions MD2 and MD3, respectively, to the right side in FIG. 7. This movement can be effected by the substrate holder movement device 3. The angular lever 2424 is then turned about its axis 2425 clockwise in FIG. 7 in a turning direction T. A second lever section 2427 of the angular lever 2424 which is protruding to the left side end in FIG. 7 touches the arm spreading actuation bar 2421 and moves it upwards in FIG. 7 in the movement direction MD1. This has the effect that the substrate holder clamping arms 22 move away from each other as explained in regard of FIG. 6. In this way, the camping mechanism can be opened by driving the substrate holder clamping device 2 to the right in FIG. 7 until the stopper, against which the angular lever 2424 can run, is reached by the angular lever 2424 and the angular lever 2424 is turned to release the substrate holder. The substrate holder is then not clamped any more but only supported by the substrate holder supports 251 as shown in FIG. 4 for one side of the substrate holder 11.

FIG. 8 shows in a perspective view the substrate holder movement device 3. The substrate holder movement device 3 comprises an x-axis drive 31 and a y-axis drive 32. The x-axis drive 31 can move the substrate holder clamping device 2, as shown in FIG. 7, to the left and to the right. The y-axis drive 32 can move the substrate holder clamping device 2, as shown in FIG. 7, up and down. The x-axis drive comprises an x-axis electric motor 311, an x-axis leadscrew 312 and an associated x-axis nut 313. The y-axis drive comprises a y-axis electric motor 321, a y-axis leadscrew 322 and an associated y-axis nut 323. Further, the substrate holder movement device 3 comprises a movement device frame 33 to which the x-axis electric motor 311 and the y-axis electric motor 321 are attached. The ends of the x-axis leadscrew 312 and the y-axis leadscrew 322 are supported by an x-axis leadscrew bearing 314 and a y-axis leadscrew bearing 324, respectively, which are attached to the movement device frame 33.

The y-axis nut 323 is mechanically connected to a moved frame 34. To the moved frame 34, in turn, the substrate holder clamping device 2 can be attached by four fastenings screws 341. The fastening screws 341 can be screwed into the fastening holes 271 in the fastening devices 27 which are shown in FIG. 7. In this way, the substrate holder clamping device 2 can be moved by the y-axis electric motor 321. This movement is guided by two y-axis guides 325 which are arranged in parallel between the movement device frame 33 and the moved frame 34. Up and down means the up and down directions in all Figures, which is called the y-axis direction.

The x-axis nut 313 is mechanically connected to an intermediate frame 35 which is also attached to the clamping device frame 26 as shown in FIGS. 1 to 7. In this way, a relative movement between the fastening devices 27 which can move along the guide rods 2412 and the clamping device frame 26 can be effected by the x-axis electric motor 321. As the fastening devices 27 are not movable to the left and the right, the rest of the substrate clamping device 2 exerts the relative movement to the left and the right. In this way, the guide rods 2412 have a double function, namely to act as an x-axis guide for movements in x-axis direction and as a guide for the substrate holder clamping arms 22. Left and right means the left and right directions in FIGS. 6, 7 and 10 which is called the x-axis direction.

The intermediate frame 35 comprises an intermediate frame main part 352 and an intermediate frame guide 351 which is a guide in y-axis direction and which is movable relatively to the intermediate frame main part 352. The x-axis nut 313 is mechanically connected to the intermediate frame main part 352. The intermediate frame guide 351 is fixed at the clamping device frame 26. Because of the intermediate frame guide 351, the x-axis electric motor 311 can be stationary and be fixed to the movement device frame 33 as the intermediate frame guide 351 compensates for movements of the substrate holder clamping device 2 in the y-axis direction. Thus, both the x-axis and the y-axis electric motors 311, 321 do not move with the substrate holder clamping device 2. This has advantages in that the moved masses are lower and cables to the x-axis and y-axis motor 311, 321 are stationary.

The above-mentioned stopper which is not shown in the Figures and by which the clamping process can be initiated is preferably arranged such that a movement to the end of the movement range to one side in respect to FIG. 6, preferably the right side, leads to an opening of the substrate holder clamping mechanism 24 which releases the substrate holder. The substrate holder can then, for example, be exchanged, such that another substrate can be treated. Moving the substrate holder clamping mechanism 24 away from the stopper leads to clamping of the substrate holder with the effects of alignment and electrical connection.

The whole substrate holder reception apparatus 1 can be removed from the machine frame 4 by releasing the end of the x-axis leadscrew 312 from the x-axis leadscrew bearing 314 and by screwing out the machine frame screws 41 which means a low effort for doing so. The substrate holder clamping device 2 and the substrate holder movement device 3 can be detached from each other by screwing out the fastenings screws 341. This is also a low effort for doing so.

FIG. 9 schematically shows the substrate holder movement device 3 of FIG. 8 in another perspective view, but from the same side as FIG. 8. Same features are indicated by the same reference and numerals, and are not described once again. The construction of the movement device frame 33 is better visible in FIG. 9.

FIG. 10 shows schematically in a perspective view the substrate holder movement device 3 of FIG. 8 from the opposite side as shown in FIG. 8. Same features are indicated by the same reference and numerals, and are not described once again. From this side, the intermediate frame guide 351 is visible better in FIG. 10.

FIG. 11 shows schematically a view of an electrochemical treatment apparatus 5 comprising machine frame 4 with an anode holder 42 which is holding an anode 421. Further, the machine frame 4 supports a substrate holder reception apparatus 1, which comprises a substrate holder clamping device 2 and a substrate holder movement device 3. The substrate holder clamping device 2 clamps a substrate holder 11 which in turn holds a substrate 111. The substrate 111 and the anode 421 are immersed in an electrolytic fluid 511 which is contained in an electrolyte basin in 51. In this way, electric current can flow from the anode 421 to the substrate 111 in order to treat the substrate 111. Particularly, the substrate 111 is galvanised.

LIST OF REFERENCE NUMERALS

1 Substrate holder reception apparatus
11 Substrate holder
111 Alignment end of substrate holder
112 Contact end of substrate holder
113 Substrate
2 Substrate holder clamping device
21 Substrate holder connection device
211 Substrate holder alignment device
2111 Alignment device spring arrangement
2112 Alignment surface
2113 First alignment surface section
2114 Second alignment surface section
212 Substrate holder contact device
2121 Contact surface
213 Connection balance
2131 First connection balance lever
2132 Second connection balance lever
214 Connection balance axis
215 Housing
22 Substrate holder clamping arm
23 Current supply cable
24 Substrate holder clamping mechanism
241 Guide mechanism
2411 Guide bearing
2412 Guide rod
242 Arm spreading device
2421 Arm spreading actuation bar
2422 Arm spreading actuation lever
2423 Guide rod bridge
2424 Angular lever
2425 Angular lever axis
2426 First lever section
2427 Second lever section
25 Frame bridge
251 Substrate holder support
26 Clamping device frame
27 Fastening device
271 Fastening holes
272 Fastening device rod bearing
3 Substrate holder movement device
31 x-axis drive
311 x-axis electric motor
312 x-axis leadscrew
313 x-axis nut
314 x-axis leadscrew bearing
32 y-axis drive
321 y-axis electric motor
322 y-axis leadscrew
323 y-axis nut
324 y-axis leadscrew bearing
325 y-axis guide
33 Movement device frame
34 Moved frame
341 Fastening screws
35 Intermediate frame
351 Intermediate frame guide
352 Intermediate frame main part
4 Machine frame
41 Machine frame screws
42 Anode holder
421 Anode
5 Electrochemical treatment apparatus
51 Electrolyte basin
511 Electrolytic fluid
512 Liquid level
SHCD Substrate holder clamping direction
MD1 Movement direction of the arm spreading actuation bar MD2 Movement direction of guide rods for first clamping arm
MD3 Movement direction of guide rods for second clamping arm
T Turning direction

The invention claimed is:

1. Substrate holder reception apparatus for clamping a substrate holder in a substrate holder clamping direction (SHCD) in a predetermined position of the substrate holder and releasing the substrate holder characterized in that
the substrate holder reception apparatus comprises a substrate holder clamping device configured to receive the substrate holder; wherein the substrate holder clamping device comprises at least one substrate holder connection device for mechanical aligning and electrically contacting of the substrate holder and at least one substrate holder clamping arm, wherein the at least one substrate holder connection device, which is arranged at the end of at least one substrate holder clamping arm, comprises a separate substrate holder alignment device for aligning the at least one substrate holder with the substrate holder connection device in an alignment direction, and at least one separate substrate holder contact device for electrically contacting the substrate holder; wherein the substrate holder reception apparatus is configured to first align the substrate holder and to afterwards bring the at least one substrate holder contact device into contact with the substrate holder, in the clamping process; wherein when the substrate holder reception apparatus does not clamp the substrate holder, the at least one substrate holder alignment device protrudes further towards a predetermined position of the substrate holder than the at least one substrate holder contact device.

2. Substrate holder reception apparatus according to claim 1, characterized in that the substrate holder reception apparatus provides means for conducting warmth away from the substrate holder reception apparatus selected from the group consisting of active cooling devices, passive cooling devices or combinations thereof.

3. Substrate holder reception apparatus according to claim 2, characterized in that the active cooling device is based on a gas stream and/or the passive cooling device comprises a cooling fin.

4. Substrate holder reception apparatus according to claim 1 characterized in that the substrate holder reception apparatus comprises two substrate holder connection devices for connecting the substrate holder.

5. Substrate holder reception apparatus according to claim 1, characterized in that the at least one substrate holder alignment device is movable towards the substrate holder by clamping action of a substrate holder clamping mechanism and is supported by an alignment device spring arrangement which is compressible when the at least one substrate holder alignment device touches the substrate holder and the substrate holder clamping mechanism effects the clamping action.

6. Substrate holder reception apparatus according to claim 5, characterized in that the at least one substrate holder connection device comprises a connection balance which is movable towards the substrate holder by the substrate holder clamping mechanism and which supports the at least one substrate holder alignment device at a first connection balance lever and the substrate holder contact device at a second connection balance lever, wherein between the first connection balance lever and the at least one substrate holder alignment device, the alignment device spring arrangement is arranged.

7. Substrate holder reception apparatus according to claim 1, characterized in that at least one substrate holder alignment device and/or the at least one substrate holder contact device are movable by the at least one substrate holder clamping arm, wherein the at least one substrate holder clamping arm has an elastic effect throughout a clamping process, and wherein the at least one substrate holder clamping arm is arranged at an angle to the substrate holder clamping direction (SHCD).

8. Substrate holder reception apparatus according to claim 1, characterized in that the at least one substrate holder alignment device has at least one alignment surface comprising at least two alignment surface sections which are arranged at a distance from each other, wherein the alignment surface sections each have a concave or convex shape with a protrusion or a recess in the substrate holder clamping direction (SHCD) and with flanks of the protrusion or the recess which are arranged at an angle greater than 1° and less than 89° to the substrate holder clamping direction (SHCD).

9. Substrate holder reception apparatus according to claim 1, characterized in that the at least one substrate holder contact device has a plane contact surface which is oriented perpendicular to the substrate holder clamping direction (SHCD), and/or wherein the at least one substrate holder alignment device is configured to transfer electric current to the substrate holder.

10. Substrate holder reception apparatus according to claim 1, characterized in that the substrate holder reception apparatus comprises the substrate holder clamping device with a substrate holder clamping mechanism which comprises a guide mechanism with a guide rod and a guide bearing for guiding the guide rod, wherein the guide rod is moveable to clamp the substrate holder; wherein a fastening device, which is provided for fastening the substrate holder clamping device to a substrate holder movement device, comprises a fastening device bearing, which is arranged to guide the guide rod in order to enable a relative movement between the substrate holder clamping mechanism and the fastening device.

11. Substrate holder reception apparatus according to claim 10, characterised in that the substrate holder clamping device is separable from the substrate holder movement device as a unit when unfastening the fastening device from the substrate holder movement device.

12. Substrate holder reception apparatus according to claim 1, characterized in that the substrate holder reception apparatus comprises the substrate holder clamping device with a substrate holder connection device and comprises a substrate holder movement device for moving the substrate holder clamping device in two different directions, wherein the substrate holder movement device comprises a stationary movement device frame, an x-axis drive having an x-axis electric motor and a y-axis drive having a y-axis electric motor, wherein the x-axis electric motor and the y-axis electric motor are mechanically fixed to the movement device frame such that the x-axis electric motor and the y-axis electric motor are stationary regarding movements they effect at the substrate holder clamping device, wherein a first one of the electric drives is arranged between the movement device frame and the substrate holder clamping device, and a second one of the electric drives is arranged between the movement device frame and an intermediate frame which, for compensation of movements of the first electric drive, is mechanically connected to the substrate holder clamping device via an intermediate frame guide.

13. Substrate holder reception apparatus according to claim 8 further comprising a second substrate holder alignment device which comprises at least one alignment surface comprising at least one alignment surface sections, wherein the alignment surface section has a concave or convex shape with a protrusion or a recess in direction to the substrate holder, and with flanks of the protrusion or the recess which are arranged at an angle greater than 1° and less than 89° to the substrate holder clamping direction (SHCD).

14. Substrate holder reception apparatus according to claim 4, characterized in that the at least one substrate holder alignment device is movable towards the substrate holder by clamping action of a substrate holder clamping mechanism and is supported by an alignment device spring arrangement which is compressible when the at least one substrate holder alignment device touches the substrate holder and the substrate holder clamping mechanism effects the clamping action.

15. Substrate holder reception apparatus according to claim 4, characterized in that at least one substrate holder alignment device has at least one alignment surface comprising at least two alignment surface sections which are arranged at a distance from each other, wherein the alignment surface sections—each have a concave or convex shape with a protrusion or a recess in the substrate holder clamping direction (SHCD) and with flanks of the protrusion or the recess which are arranged at an angle greater than 1° and less than 89° to the substrate holder clamping direction (SHCD).

16. Substrate holder reception apparatus according to claim 14, characterized in that at least one substrate holder alignment device has at least one alignment surface comprising at least two alignment surface sections which are arranged at a distance from each other, wherein the alignment surface sections each have a concave or convex shape with a protrusion or a recess in the substrate holder clamping direction (SHCD) and with flanks of the protrusion or the recess which are arranged at an angle greater than 1° and less than 89° to the substrate holder clamping direction (SHCD).

17. Substrate holder reception apparatus according to claim 4, characterized in that the substrate holder contact device has a plane contact surface which is oriented perpendicular to the substrate holder clamping direction (SHCD), and/or wherein the substrate holder alignment device is configured to transfer electric current to the substrate holder.

18. Electrochemical treatment apparatus for treating a substrate which acts as a cathode in an electrolytic fluid, the electrochemical treatment apparatus comprising an anode and the substrate holder reception apparatus (1) according to claim 1, wherein an active surface of the anode, in operation, is directed to the substrate, characterized in that the anode has a distance to the substrate of less than 25 mm.

19. Electrochemical treatment apparatus according to claim 18, characterized in that the electrochemical treatment apparatus comprises two anodes which are arranged to face each other and wherein the electrochemical treatment apparatus is configured such that, in operation, the substrate is receivable between the anodes, wherein a distance between the anodes is less than 50 mm.

20. Electrochemical treatment apparatus according claim 18, characterized in that the at least one substrate holder connection device, in operation of the substrate holder reception apparatus, is arranged above a liquid level of the electrolytic fluid.

\* \* \* \* \*